US011302471B2

(12) United States Patent
Palumbo et al.

(10) Patent No.: US 11,302,471 B2
(45) Date of Patent: Apr. 12, 2022

(54) INTEGRATED TRANSFORMER

(71) Applicant: STMicroelectronics S.r.l., Agrate Brianza (IT)

(72) Inventors: Vincenzo Palumbo, Vimercate (IT); Gabriella Ghidini, Milan (IT); Enzo Carollo, Montecchio Prec. Vincenza (IT); Fabrizio Fausto Renzo Toia, Busto Arsizio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 10 days.

(21) Appl. No.: 16/744,484

(22) Filed: Jan. 16, 2020

(65) Prior Publication Data
US 2020/0152377 A1 May 14, 2020

Related U.S. Application Data

(60) Division of application No. 16/267,811, filed on Feb. 5, 2019, now Pat. No. 10,541,079, which is a (Continued)

(30) Foreign Application Priority Data

Jun. 16, 2014 (IT) .......................... MI2014A001088

(51) Int. Cl.
*H01F 27/28* (2006.01)
*H01F 27/32* (2006.01)
(Continued)

(52) U.S. Cl.
CPC ......... *H01F 27/32* (2013.01); *H01F 27/2804* (2013.01); *H01F 27/323* (2013.01);
(Continued)

(58) Field of Classification Search
CPC .... H01F 27/2804; H01F 27/32; H01F 27/323; H01F 2027/2809; H01L 23/5227;
(Continued)

(56) References Cited

U.S. PATENT DOCUMENTS 5,598,136 A * 1/1997 Kano ...................... H01F 5/003
336/200
6,204,997 B1 * 3/2001 Sasaki .................. G11B 5/3123
360/123.39
(Continued)

FOREIGN PATENT DOCUMENTS

CN 102176453 A 9/2011
CN 102522388 A 6/2012
(Continued)

OTHER PUBLICATIONS

First Office Action and Search Report for co-pending CN Appl. No. 201510335192.6 dated Oct. 8, 2016 (6 pages).
(Continued)

*Primary Examiner* — Tszfung J Chan
(74) *Attorney, Agent, or Firm* — Crowe & Dunlevy

(57) ABSTRACT

An integrated transformer includes a primary winding and a secondary winding each having a spiral planar arrangement coils. A dielectric portion of dielectric material is interposed between the primary winding and the secondary winding. A field plate winding is electrically coupled with the primary winding. The field plate winding includes at least one field plate coil having a first lateral extension greater than a second lateral extension of a primary outer coil of the primary winding. The field plate coil is superimposed in plan view to the primary outer coil of the primary winding.

8 Claims, 6 Drawing Sheets

Related U.S. Application Data continuation of application No. 14/733,009, filed on Jun. 8, 2015, now Pat. No. 10,236,115.

(51) Int. Cl.

| | | |
|---|---|---|
| *H01L 23/522* | (2006.01) | |
| *H01L 23/64* | (2006.01) | |
| *H01L 27/08* | (2006.01) | |
| *H01F 41/063* | (2016.01) | |
| *H01L 23/66* | (2006.01) | |

(52) U.S. Cl.
CPC ....... *H01F 41/063* (2016.01); *H01L 23/5227* (2013.01); *H01L 23/645* (2013.01); *H01L 23/66* (2013.01); *H01L 27/08* (2013.01); *H01F 2027/2809* (2013.01); *H01L 2223/64* (2013.01); *H01L 2924/0002* (2013.01); *Y10T 29/49021* (2015.01)

(58) Field of Classification Search
CPC ....... H01L 23/645; H01L 23/66; H01L 27/08; H01L 2223/64; H01L 2924/0002
USPC .................................................. 336/200, 232
See application file for complete search history.

(56) References Cited

U.S. PATENT DOCUMENTS

| | | | | |
|---|---|---|---|---|
| 6,381,095 B1* | 4/2002 | Sin | ........................ | G11B 5/313 360/122 |
| 7,843,701 B2* | 11/2010 | Kudo | .................... | H01F 27/027 361/760 |
| 7,994,890 B2* | 8/2011 | Edo | ........................ | H03K 17/18 336/200 |
| 2004/0056749 A1* | 3/2004 | Kahlmann | .............. | H01L 27/08 336/200 |
| 2007/0216509 A1* | 9/2007 | Yen | ......................... | H01L 28/40 336/200 |
| 2009/0046489 A1* | 2/2009 | Yoshimura | .............. | H01L 28/10 363/123 |
| 2010/0109123 A1* | 5/2010 | Strzalkowski | ......... | H05K 1/165 257/531 |
| 2011/0235302 A1 | 9/2011 | Hijioka et al. | | |
| 2012/0115300 A1* | 5/2012 | Hirota | ............... | H01L 27/10852 438/381 |
| 2012/0181874 A1* | 7/2012 | Willkofer | ................ | H01L 23/48 307/104 |
| 2013/0106554 A1 | 5/2013 | Girard et al. | | |
| 2014/0042612 A1 | 2/2014 | Liu et al. | | |
| 2014/0354392 A1 | 12/2014 | Cooney, III et al. | | |
| 2015/0130579 A1 | 5/2015 | Kim et al. | | |
| 2015/0371998 A1* | 12/2015 | Lue | .................. | H01L 29/66833 257/326 |
| 2016/0035672 A1 | 2/2016 | Funaya et al. | | |

FOREIGN PATENT DOCUMENTS

| | | |
|---|---|---|
| JP | 2001044035 A | 2/2001 |
| JP | 2003008009 A | 1/2003 |
| JP | 2010114283 A | 5/2010 |
| JP | 2010118563 A | 5/2010 |
| JP | 2010199241 A | 9/2010 |

OTHER PUBLICATIONS

Italian Search Report and Written Opinion for IT MI2014A001088 dated Sep. 16, 2014 (7 pages).

* cited by examiner

INTEGRATED TRANSFORMER

CROSS REFERENCE TO RELATED APPLICATIONS

This application is a divisional of U.S. patent application Ser. No. 16/267,811 filed Feb. 5, 2019, now U.S. Pat. No. 10,541,079, which is a continuation of U.S. patent application Ser. No. 14/733,009 filed Jun. 8, 2015, now U.S. Pat. No. 10,236,115, which claims priority from Italian Application for Patent No. MI2014A001088 filed Jun. 16, 2014, the disclosures of which are incorporated by reference.

TECHNICAL FIELD

The present invention relates to the field of electronics. In greater detail, the present invention relates to integrated inductive components, in particular integrated transformers.

BACKGROUND

Transformers are components widely used in the electronics industry, in particular in radio frequency electronic devices (for example, transceivers) and in power electronic devices (for example, voltage transformers).

The constant process of miniaturization (scaling) of the electronic circuits and a consequent development of (electronic) System-on-Chip (SoC) devices (i.e., complex electronic systems integrated on a chip semiconductor material (for example, silicon)), has led to the provision of miniaturized integrated inductors and, consequently, to the provision of integrated transformers that allow the manufacturing of a SoC comprising such (integrated) radio frequency circuit portions and/or (integrated) power circuit portions.

In general, an integrated transformer, simply "transformer" in the following, comprises two or more (integrated) inductors, each formed by means of a strip of metallic material (e.g., aluminum or copper) with a spiral arrangement. For example, the metallic material of the inductors is comprised in a metallization layer of an integrated circuit of which the inductor is part.

Due to the extremely small size of these inductors, operating voltages to which inductors are subjected during their operation can lead to a deterioration thereof (leading to a reduction of their operating efficiency), up to their complete destruction (which prevents the proper functioning of a SoC in which they are integrated).

For example, by considering a voltage transformer circuit, it usually comprises a primary winding that comprises an inductor formed by a corresponding metallization layer and a secondary winding that comprises another inductor formed by a corresponding different metallization layer. The two windings are separated by a layer (or layers) of insulating material. In a structure of this type, the operating voltage present between the two windings of the transformer or an extraordinary event (such as a peak in the supply voltage) on the power grid where the transformer is connected or a voltage stress applied during tests performed on the transformer (required for certification of galvanic isolation thereof) may require an electric field between the two windings that generates harmful effects on the transformer. In particular, in correspondence of an (or more) outer coil(s) of the inductor that forms the primary winding (i.e., the transformer winding to which is applied a potential difference having the greater value), subjected to a high intensity voltage (e.g., provided by an electric network or from a power supply block), the physical phenomenon called fringing effect may occur.

The fringing effect causes a local concentration of the electric field in correspondence of an edge (or fringe) of the outer coil of the inductor which forms the upper winding, henceforth referred to as the primary winding. This local concentration of the electric field due to the effect of the edge may cause a deterioration, up to a rupture (or burning), of the primary winding, thereby compromising, or even preventing, the operation of the transformer (and therefore of a SoC to which the circuit belongs).

SUMMARY

In general terms, the solution according to one or more embodiments provides a transformer structure adapted to suppress, or at least to substantially mitigate the disadvantages associated with the fringing effects due to an electric field generated by the voltage existing between the two windings.

More specifically, one aspect of the solution according to an embodiment provides an integrated transformer. The integrated transformer comprises a primary winding and a secondary winding, each made of metallic material and having a spiral planar arrangement comprising a corresponding plurality of coils, and a dielectric portion of dielectric material interposed between the primary winding and the secondary winding. In the solution according to an embodiment, the integrated transformer further comprises a field plate winding electrically coupled with the primary winding. The field plate winding comprises at least one field plate coil having a lateral extension greater than a lateral extension of a primary outer coil of the primary winding with the at least one field plate coil superimposed in plan view to the primary outer coil of the primary winding. The field plate winding is adapted to separate one from the other equipotential surfaces of an operating electric field in correspondence of an edge facing the secondary winding of the primary outer coil of the primary winding.

Another aspect provides a system on chip comprising at least one transformer mentioned above.

A different aspect provides an electronic apparatus comprising at least a system on chip mentioned above.

A further aspect provides a method for integrating such a transformer in a chip of semiconductor material.

BRIEF DESCRIPTION OF THE DRAWINGS

A solution of the present disclosure, as well as additional features and its advantages, will be better understood with reference to the following detailed description, given purely by way of indication and without limitation, to be read in conjunction with the attached figures (wherein corresponding elements are denoted with equal or similar references and their explanation is not repeated for the sake of brevity). In this respect, it is expressly intended that the figures are not necessarily to scale (with some details that may be exaggerated and/or simplified) and that, unless otherwise indicated, they are simply used to conceptually illustrate the described structures and procedures. In particular.

DETAILED DESCRIPTION OF THE DRAWINGS

Figure 1A:
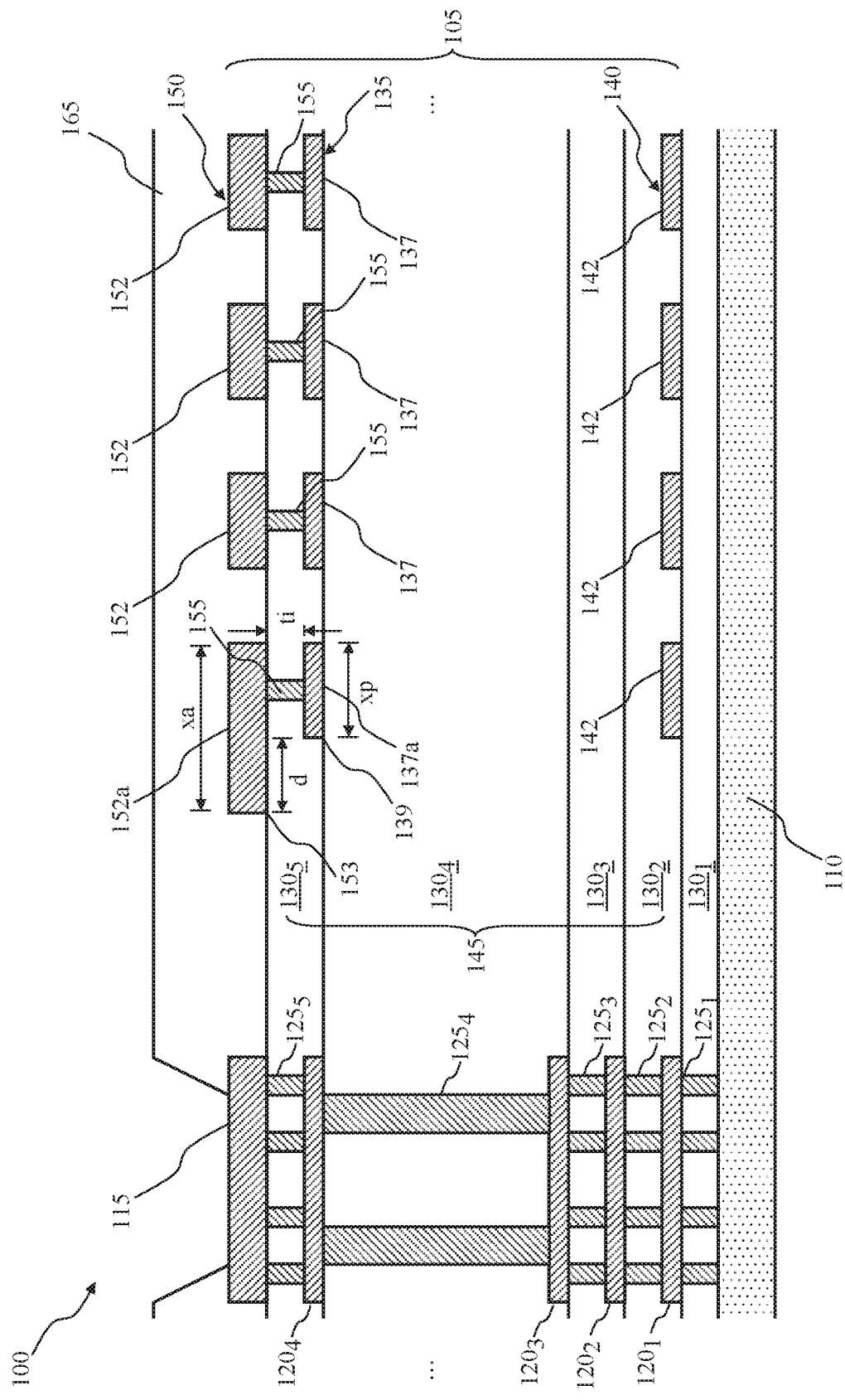
FIG. 1A is a schematic cross-sectional side view of a portion of the system on chip comprising an integrated transformer according to an embodiment.
Figure 1B:
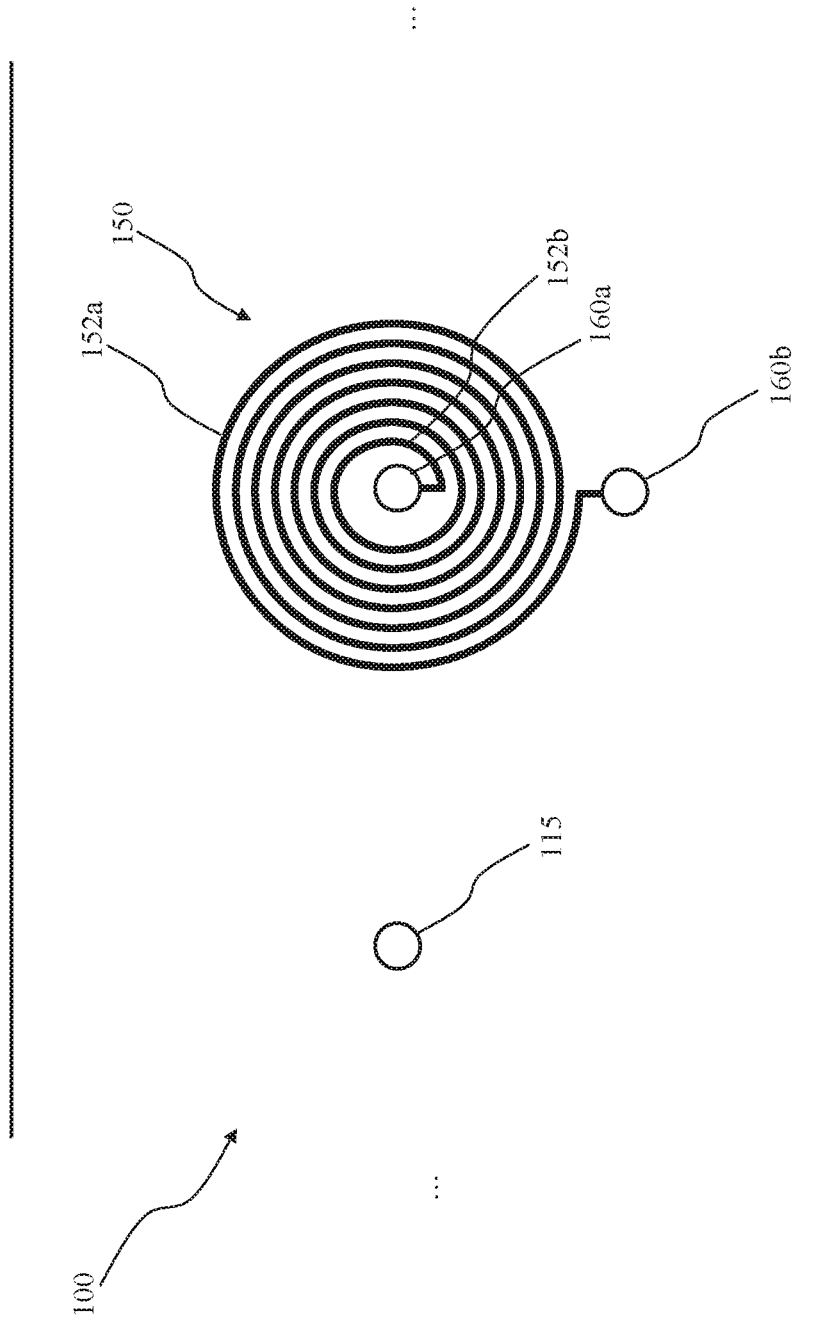
FIG. 1B is a schematic plan view of the portion of the system on chip comprising an integrated transformer of FIG. 1A.

With reference to the figures, FIGS. 1A and 1B are schematic cross-sectional and plan views, respectively, of a portion of the system on chip 100 comprising an integrated transformer 105 according to an embodiment.

The system on chip 100 comprises an integration portion 110 comprising one or more layers of semiconductor material in which are formed semiconductor electronic components (not shown for simplicity) of the system on chip 100.

The system on chip 100 also comprises a plurality of metallization layers 105 (for example, five in the example of FIG. 1A) ranging from a first metallization layer $M_1$ to a last metallization layer $M_N$ (N=5 in the example of FIG. 1A) which is typically used to form electrical contact pads, of which only a pad 115 is visible in FIGS. 1A and 1B for electrically coupling electronic components within integration portion 110 with external elements thereto (for example to electrical connection terminals via connecting wires).

The electronic components formed in the integration portion 110 are electrically coupled to electrical connecting elements $120_1$ formed in a first metallization layer $M_1$ via columns or vias $125_1$ of semiconductor material that pass through an insulating layer $130_1$ of dielectric material interposed between the integration portion 110 and the first metallization layer $M_1$. In its turn, the electrical connecting elements $120_1$, $120_2$ and $120_3$ of each metallization layer may be electrically coupled to the electrical connecting elements $120_2$, $120_3$ and $120_4$, respectively, formed in a respective upper metallization layer (i.e., each farther from integration portion 110 compared to the previous) by means of corresponding vias $125_2$, $125_3$ and $125_4$ that cross the respective insulating layers $130_2$, $130_3$ and $130_4$ in dielectric material interposed between the metallization layers $M_1$, $M_2$, $M_3$ and $M_4$.

Conversely, the electric connection element $120_4$ formed in the penultimate metal layer $M_{N-1}$ ($M_4$ in the example of FIG. 1A) is electrically coupled to the pad 115 formed in the last metallization layer $M_N$ ($M_5$ in the example of FIG. 1A) through corresponding via $125_5$ crossing a corresponding insulating layer $130_5$.

In the solution according to an embodiment, the integrated transformer 105 comprises a primary winding 135 (i.e., an inductive element) formed in the penultimate metal layer $M_{N-1}$ and a secondary winding 140 (i.e., a further inductive element) formed in the first metal layer $M_1$. The primary winding 135 and the secondary winding 140 have a planar shape and comprise a strip of metallic material having substantially spiral arrangement (i.e., an arrangement that wraps around a central point), with the primary winding 135 that comprises a plurality of primary coils 137 and the secondary winding that comprises a plurality of secondary coils 142—where "coils" refers to a primary 137 or secondary 142 winding portion whose ends define a round angle with respect to the central point of the spiral arrangement. In the example in FIG. 1B, the central points of the primary winding 135 and of the secondary winding 140 are aligned with one another (i.e., are overlapped with each other in plan view), and thus the primary winding 135 and the secondary winding 140 are superimposed in plan view; however, other arrangement of the windings are possible.

Preferably, although not necessarily, between the primary winding 135 and the secondary winding 140 no electric interconnecting elements are supplied; in other words, the primary winding 135 and the secondary winding 140 are separated by insulating layers $130_1$, $130_2$, $130_3$ and $130_4$. Therefore, the primary winding 135 and the secondary winding 140 are spaced apart by a dielectric portion 145 having thickness Td (comprising insulating layers $130_1$, $130_2$, $130_3$ and $130_4$).

In addition, the integrated transformer 105 comprises a field plate winding, simply plate winding 150 in the following, formed in the last metallization layer $M_N$.

The plate winding 150 comprises at least one outer plate coil 152a (for example, a strip of metallic material) having an arrangement superimposed in plan view to a primary outer coil 137a of the primary winding 135. Moreover, a lateral extension xa of the outer plate coil 152a is greater than a lateral extension xp of the primary outer coil 137a of the primary winding 135 in such a way that the outer plate coil 152a extends in plan view for an extension distance d beyond the primary outer coil 137a in the opposite direction with respect to the position of the other coils 137 of the primary winding 135.

For example, the plate winding 150 comprises a strip of metallic material having a substantially spiral arrangement comprising a plurality of coils 152 such as to correspond in plan view to the primary winding 135 (i.e., wrapping around a central point superimposed to the central point of the primary winding 135 with each coil 152 of the plate winding 150 superimposed in plan view to a coil 137 of the primary winding 135).

Preferably, each coil 137 of the primary winding 135 is electrically coupled to a corresponding and overlying coil 152 of the plate winding 150, for example by means of corresponding vias 155 that pass through the insulating layer $130_5$ interposed therebetween.

A pair of transformer pads 160a and 160b (visible in FIG. 1B) are provided to electrically contact the primary winding 135 and the plate winding 150. Preferably, a first transformer pad 160a is provided in correspondence of the central points around which the primary winding 135 and the plate winding 150 wraps and is electrically coupled to a most inner coil 137b and 157b thereof, while a second transformer pad 160b is provided in correspondence with, and is electrically coupled to, an end portion of the outer coils 137a and 152a of the windings 135 and 150.

Conversely, the secondary winding comprises a pair of electrical connections (not shown), one of which is coupled to an outer coil 142a and the other to a most inner coil (not visible in FIGS. 1A and 1B) of the secondary winding 140. Electrical connections are usually electrically coupled to the electronic components in the integration portion 110.

Finally, the system on chip 100 comprises an insulating surface layer 165 that covers the plate winding 150 and a surface of the most external insulating layer $130_5$ for protecting them from the external environment, leaving exposed at least a portion of the pad 115 and a portion of the transformer pads 160a and 160b (for allowing an electrical connection).

Thanks to the structure of the integrated transformer 105 just described it is possible to substantially reduce an electric field peak associated with fringing effects that may occur in correspondence of the primary outer coil 137a of the primary winding 135 during an operation of the integrated transformer 105, thereby providing greater robustness to the integrated transformer 105 with respect to transformer known.

In the embodiment, the fringing effect is developed in a distributed manner between the lower edges (i.e., facing the secondary winding 140) of the outer coils 137a and 152a of the windings 135 and 150 when a potential difference (electric) V1 (e.g., in the order of thousands of volts, as 1 kV≤V1≤10 kV) is applied between the windings 137 and 152 of the transformer.

The presence of the plate winding 150 allows for advantageously altering an electric field E1 produced by the potential difference V1 applied between the two windings 137 and 152 of the transformer with respect to the case of a known transformer. Indeed, the lower edges of the outer coils 137a and 152a lie on a same equipotential surface; therefore, the electric field E1 is distributed on the two outer coils 137a and 152a, and it is not concentrated on a single coil as in the prior art.

The extension distance d (i.e., the difference between the lateral extension xa of the plate winding 150 and the lateral extension xp of the primary winding 135 in the direction opposite to the position of the other coils 137) for which the outer plate coil 152a (in plan view) surpasses the primary outer coil 137a causes a relaxation of the electric field E1 (i.e., the equipotential surfaces of the electric field E1 are arranged with separation distances greater than in the known art). In this case, electric field peaks $E1p_{135}$ and $E1p_{150}$ are developed due to the fringe effect at the lower edges of both the outer coils 137a and 152a of the windings 135 and 150, respectively. The extension distance d between the outer coils 137a and 152a may be defined such that the electric field peaks $E1p_{135}$ and $E1p_{150}$ are not able to cause a deterioration of the integrated transformer 105.

In detail, the distribution of the equipotential surfaces of the electric field E1 is dependent on the value of the extension distance d for which the outer plate coil 152a surpasses (in plan view) the primary outer coil 137a. In particular, the distribution of the equipotential surfaces of the electric field E1 varies between a distribution in which the equipotential surfaces are concentrated at the primary outer coil 137a for a small extension distance (i.e., d→0), and a distribution in which the equipotential surfaces are concentrated at the outer plate coil 152a, for a large extension distance d; i.e., much greater than a thickness ti of the insulating layer $130_5$ that separates the primary winding 135 from the plate winding 150 (such as an extension distance d greater than 10×ti). In the first case (i.e., small extension distance d), a concentration of the equipotential surfaces focused in correspondence of the lower edge 139 (i.e., facing towards the secondary winding 140 and towards the outside of the primary winding 135) of the primary outer coil 137a determines a electric field peak $E1p_{135}$ of predominant intensity in this region (in a similar way to what happens in the known art). In the second case (i.e., large extension distance d), the concentration of the equipotential surfaces focuses in correspondence of an lower edge 153 of the outer plate coil 152a determining an electric field peak $E1p_{150}$ of predominant intensity in this region.

Therefore, it is possible to define the extension distance d (for example, 2×ti≤d≤4×ti) for which the outer plate coil 152a surpasses the primary outer coil 152a (in the opposite direction compared to the other coils 137 and 152) in such a way that the equipotential surfaces of the electric field are arranged in the space surrounding the outer coils 137a and 152a with a distance with one among the others greater than the case known in the art (in which them focus, close one with the other, at the lower bottom of the outer coil of the primary winding opposite to the other coils thereof).

In an embodiment, the extension distance d that provides greater robustness of the integrated transformer 150 appears to be the extension distance d for which the electric field peaks $E1p_{135}$ and $E1p_{150}$ are equal (i.e., $E1p_{135}=E1p_{150}$ as visible in FIG. 3 described below). In this way, a pair of electric field peaks $E1p_{135}$ and $E1p_{150}$ is obtained significantly reduced compared to an electric field peak Epn that would occur in a known transformer for the same potential difference V1 applied between the windings of the transformer (for example, $E1p_{135}=E1p_{150}\leq 85\%\cdot Epn$).

The integrated transformer 150 according to an embodiment is able to operate also with a high voltage value V1 applied between the windings 135 and 140 suppressing, or at least substantially mitigating the disadvantages, such as breaking (or burning), associated with the fringing effect due to the electric field E1 on the primary winding 135.

Figure 2:
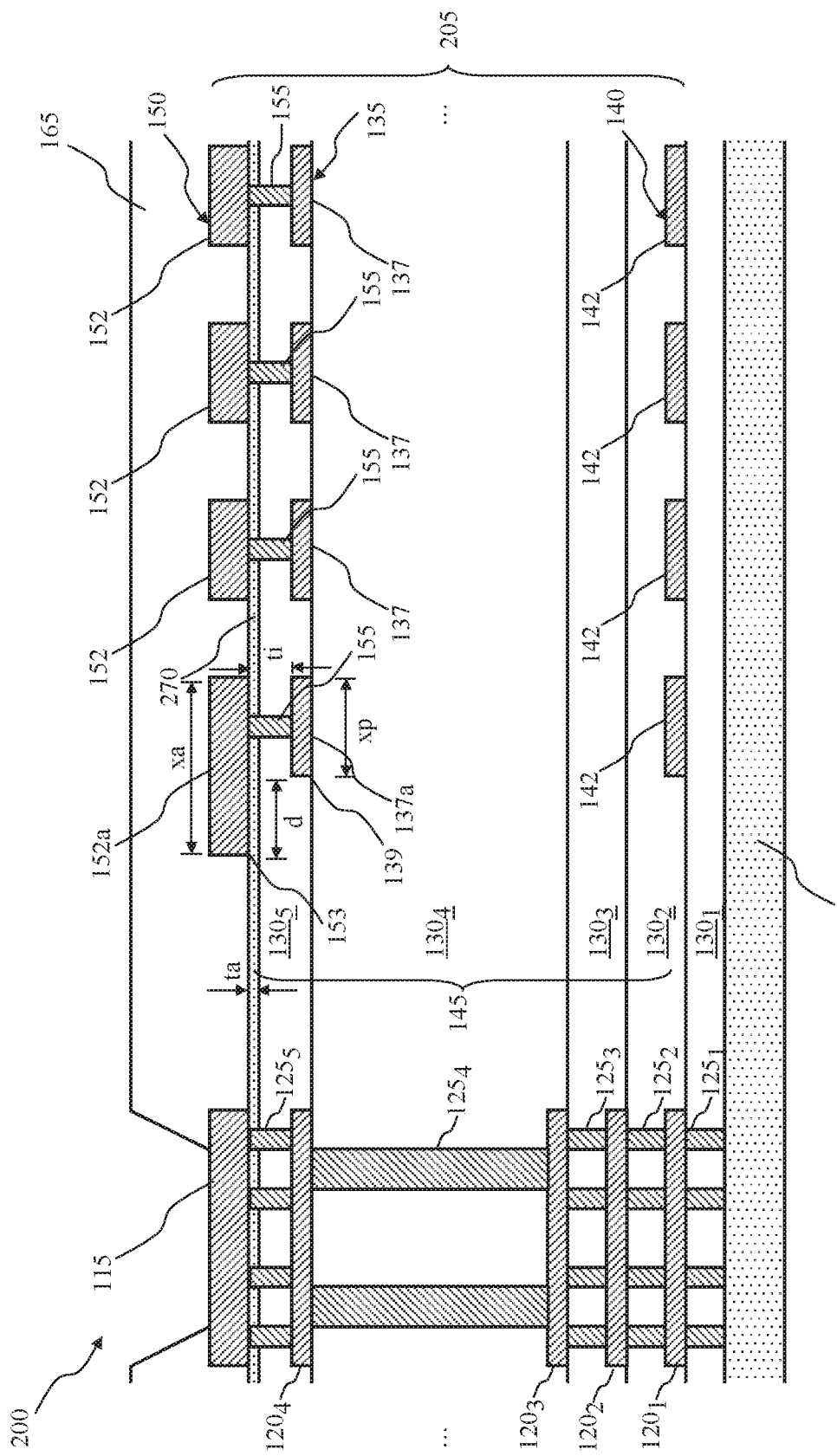
FIG. 2 is a schematic cross-sectional side view of a portion of the system on chip comprising an integrated transformer according to another embodiment.

Turning now to FIG. 2, it is a schematic cross-sectional side view of a portion of the system on chip 200 comprising an integrated transformer 205 according to another embodiment of the present invention.

The integrated transformer 205 differs from the integrated transformer 105 described above as follows (wherein similar elements are indicated by similar references and their description is not repeated for sake of brevity).

In the integrated transformer 200, an attenuation layer 270 of dielectric material is provided beneath the plate winding 150 and in contact with a lower surface of its coils 152. The attenuation layer 270 comprises a dielectric material (typically, referred to by those skilled in the art as a "high-k material") having a dielectric coefficient $\varepsilon_a$ greater than a dielectric coefficient $\varepsilon_d$ (averaged if there are more different dielectric materials) of the dielectric portion 145. For example, the dielectric portion 145 may be formed of silicon oxide $SiO_2$ and have a dielectric coefficient $\varepsilon_d=3.9$, while the attenuation layer 270 can be formed of silicon nitride $Si_3N_4$ and therefore have a dielectric coefficient $\varepsilon_a=7.5>3.9$ (examples of alternative dielectric materials suitable for use in the transformer according to alternative embodiments comprise, but are not limited to, aluminum oxide $Al_2O_3$-$\varepsilon=9$— and silicon carbide nitride SiCN-$\varepsilon 5$).

In the embodiment, the attenuation layer 270 is provided for altering an electric field E2 produced by the potential difference V2 applied between the windings 135 and 140 of the transformer at the lower edge 153 of the outer plate coil 152a of the plate winding 150.

In particular, a thickness ta of the attenuation layer 270—extending from a position of contact with the lower surface of the plate winding 150 toward the integration portion 110—is sized in such a way to increase a distance among the equipotential surfaces of the electric field E2 at the lower edge 153 of the outer plate coil 152a. Indeed, the high dielectric coefficient $\varepsilon_a$ (i.e., greater than the dielectric coefficient $\varepsilon_d$) causes a greater separation between the equipotential surfaces and the electric field E2 within the attenuation layer provided, in particular, in correspondence of the region below the edge 153 of the outer plate coil 152a—i.e., facing the opposite direction with respect to a position of the remaining coils 152 and where would occur a greater proximity among the equipotential surfaces of the electric field E2 without the attenuation layer 270—and thus the electric field peak $E2p_{150}$ therein generated is further reduced (compared to the previous case).

Advantageously, the thickness ta of the attenuation layer 270 is sized in such a way to correspond to an extension of a region in which the equipotential surface of the electric field E2 are closest in a corresponding integrated transformer (i.e., having similar structure and size) without the attenuation layer 270 (as in the case of the integrated transformer 105 shown in FIGS. 1A and 1B). The inventors have found that with such a thickness it is possible to reduce the electric field peak $E2p_{150}$ generated at the lower edge 153 of the outer plate coil 152a to a minimum value (i.e., that cannot be improved by further increasing the thickness ta). In this way, a couple of electric field peaks $E2p_{135}$ and $E2p_{150}$ significantly reduced compared to the previous case illustrated in relation to FIGS. 1A and 1B are obtained, and thus further reduced compared to the electric field peak Epn (in the order of MV/cm) that would occur in a known transformer for the same potential difference V2 applied between the windings 135 and 140 of the integrated transformer 205 (for example, $E2p_{135} = E2p_{150} \leq 75\% \cdot Epn$). Therefore, the integrated transformer 205, according to an embodiment, allows suppressing, or at least substantially mitigating, the disadvantages associated with the fringing effects due to the electric field E2 with greater efficiency compared to the previous case (thanks to the attenuation layer 270).

It should also be noted that the attenuation layer 270 disposed in contact with the lower surfaces of each coil 152 in the integrated transformer 205 allows altering the electric field E2 also at the remaining edges of each coil 152 of the plate winding 150; consequently, also the secondary electric field peaks that may be generated in correspondence of the remaining edges of each coil 152 in the integrated transformer 205 are reduced.

In an alternative embodiment (not shown) may be provided an attenuation layer alternative that entirely covers each coil of the plate winding.

Figure 3:
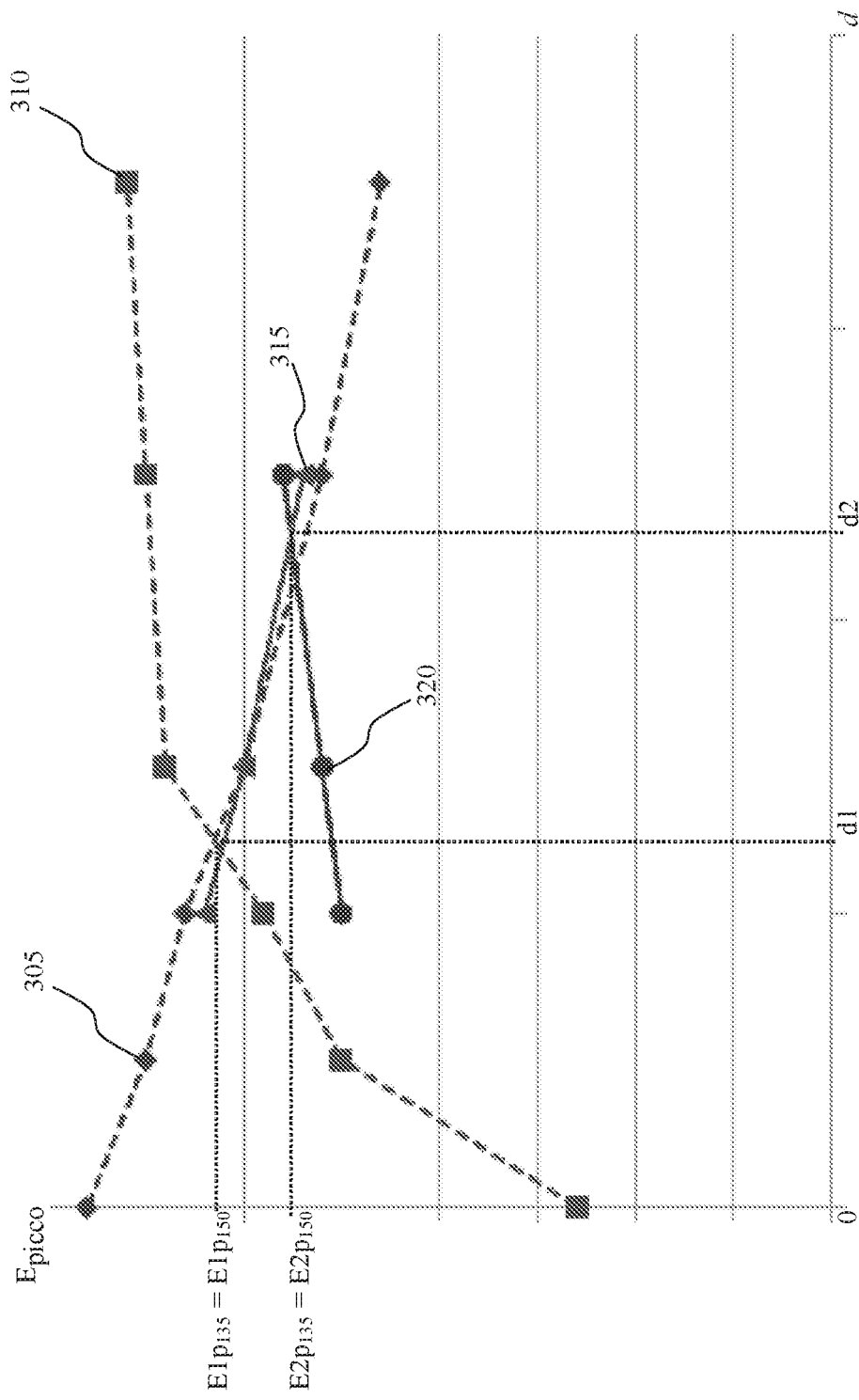
FIG. 3 is a qualitative graph that illustrates the advantages of the transformer of FIGS. 1A, 1B and 2 in terms of an electric field peak due to fringing effect.

FIG. 3 is a qualitative graph that illustrates the advantages of the transformers of FIGS. 1A, 1B and 2 in terms of an electric field peak due to fringing effect.

The graph plots the trends of the electric field peak $E1p_{135}$, $E1p_{150}$, $E2p_{135}$ and $E2p_{150}$ (on the ordinate) as a function of the extension distance d (on the abscissa).

In detail, a curve 305 represents the trend of the electric field peak $E1p_{135}$, a curve 310 represents the trend of the electric field peak $E1p_{150}$, a curve 315 represents the trend of the electric field peak $E2p_{135}$ and a curve 320 represents the trend of the electric field peak $E2p_{150}$.

As mentioned above, the intersection between the curves 305 and 310 corresponds to the extension distance d1 for which the two electric field peaks $E1p_{135}$ and $E1p_{150}$ are equivalent and have a more uniform and spaced apart distribution of equipotential surfaces of the electric field E1 for the transformer 105 described with respect to FIGS. 1A and 1B.

Similarly, the intersection between the curves 315 and 320 corresponds to the extension distance d2 for which the two electric field peaks $E2p_{135}$ and $E2p_{150}$ are equivalent, and it has a more uniform and spaced apart distribution of equipotential surfaces of the electric field E2 for the transformer 205 described with respect to FIG. 2.

It is possible to appreciate how the structure of the integrated transformer 205 (comprising the attenuation layer 270) allows obtaining the intersection between the curves 315 and 320 to an intensity of the electric field peaks $E2p_{135}$ and $E2p_{150}$ substantially lower than the intensity of the electric field peaks $E2p_{135}$ and $E2p_{150}$ which takes the intersection between the curves 305 and 310 (referred to the integrated transformer 105) for a corresponding plate winding 150.

Figure 4:
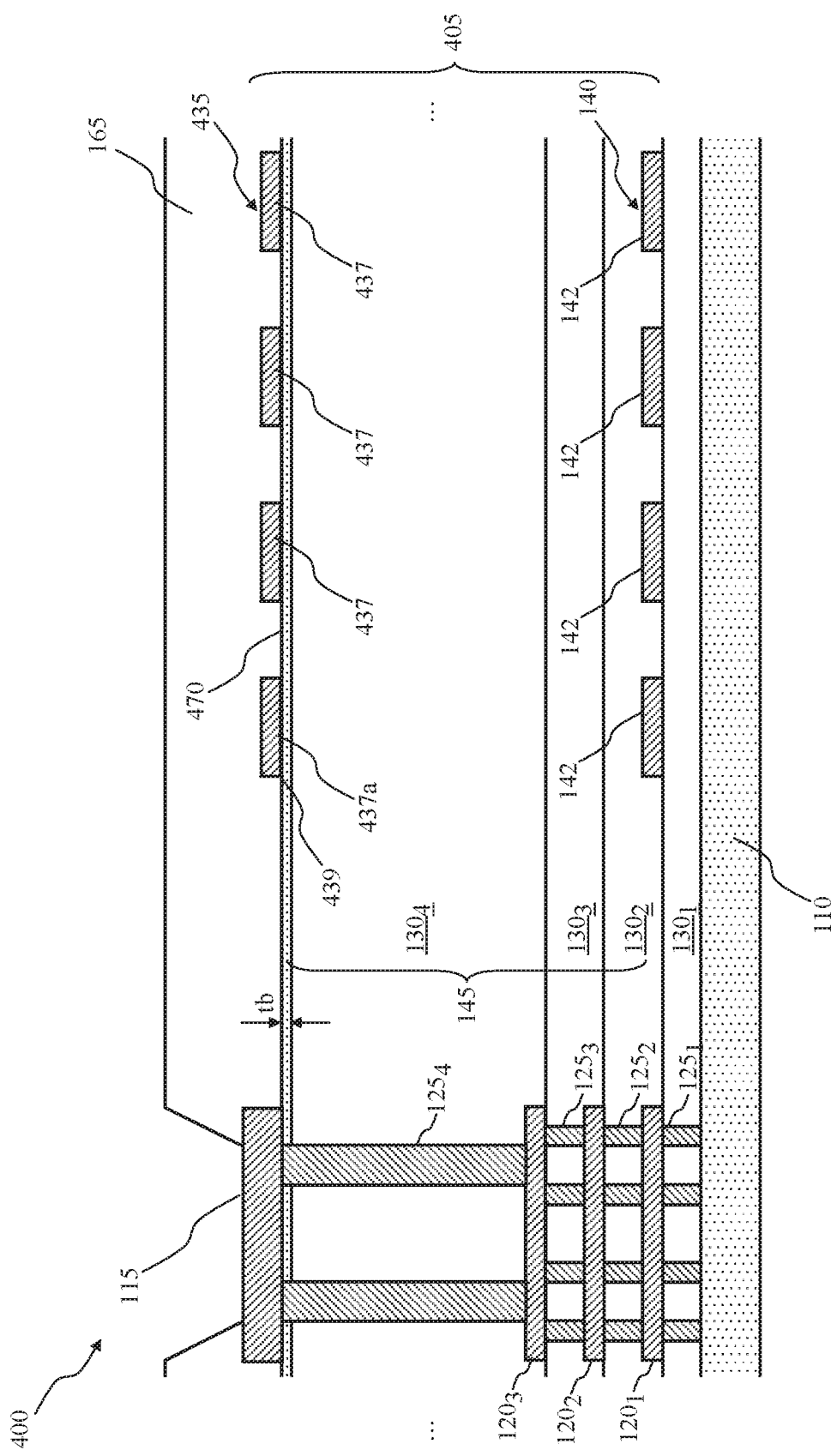
FIG. 4 is a schematic cross-sectional side view of a portion of the system on chip comprising an integrated transformer according to a different embodiment.

Turning now to FIG. 4, it is a schematic view in side section of a portion of the system on chip 400 comprising an integrated transformer 405 according to a different embodiment.

The integrated transformer 405 differs from the integrated transformers 105 and 205 previously described in the following (wherein similar elements are indicated by similar references and their description is not repeated for sake of brevity).

The integrated transformer 405 does not comprise any plate winding and the primary winding 435 is provided in the last metallization layer $M_N$ (N=4 in the example of FIG. 4).

In integrated transformer 400, an attenuation layer 470 of dielectric material is provided beneath the primary winding 435 and in contact with a lower surface of its coils 437. Similarly to the case of the integrated transformer 205, the attenuation layer 470 comprises a dielectric material having a dielectric coefficient $\varepsilon_a$ greater than a dielectric coefficient $\varepsilon_d$ (averaged if there are multiple different dielectric materials) of the dielectric portion 145.

In the embodiment, the attenuation layer 470 is provided for altering an electric field E4 produced by a potential difference V4 applied between the transformer pads (not shown) in correspondence of the lower edge 439 of the primary outer coil 437a of the primary winding 435.

Similarly to what above described, a thickness tb of the attenuation layer 470—extending from a contact position with the lower surface of the primary winding 435 towards the integration portion 110—is sized in such a way to increase a distance between the equipotential surfaces of the electric field E4 at the lower edge 439 of the primary outer coil 437a. Indeed, the high dielectric coefficient $\varepsilon_a$ (i.e., greater than the dielectric coefficient $\varepsilon_d$) causes a greater separation between the equipotential surfaces of the electric field E4 within the attenuation layer 470 provided, in particular, in correspondence of the region beneath the edge 439 of the primary outer coil 437a (i.e., where a greater proximity among equipotential surfaces of the electric field E4 would occur) and thus is possible to reduce an electric field peak E4p generated therein.

Advantageously, the thickness tb of the attenuation layer 470 is dimensioned in such a way to correspond to an extension of a region in which the equipotential surfaces of the electric field E4 are closer in a corresponding integrated transformer in which the attenuation layer 470 is not provided. With this thickness it is possible to reduce the electric field peak E4p generated in correspondence of the edge 439 of the primary outer loop 437a to a minimum value (that cannot be improved by increasing the thickness tb). In this way, an electric field peak E4p significantly reduced is obtained compared to the electric field peak Epn (of the order of MV/cm) that would occur in a known transformer for the same potential difference V4 applied between the windings 435 and 140 (e.g., $E4p \leq 85\% \cdot Epn$).

Figure 5:
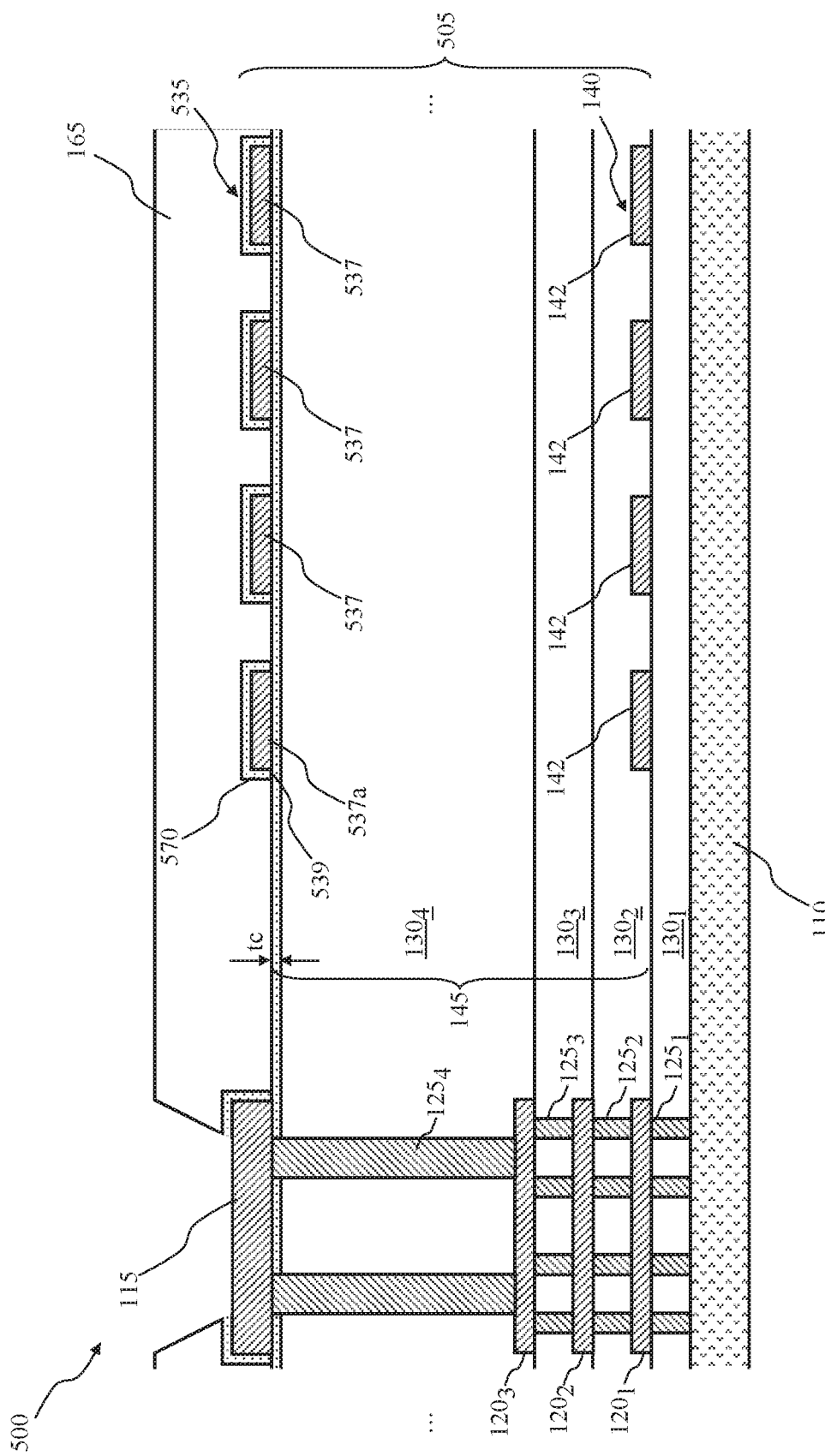
FIG. 5 is a schematic cross-sectional view of a portion of the system on chip comprising an integrated transformer according to an alternative embodiment.

Turning now to FIG. 5, it is a schematic view in side section of a portion of the system on chip 500 comprising an integrated transformer 505 according to an alternative embodiment.

The integrated transformer 505 differs from the integrated transformer 405 described above as follows (wherein similar elements are indicated by similar references and their description is not repeated for sake of brevity).

In the integrated transformer 505, an attenuation layer 570 of dielectric material is provided in such a way to surround each coil 537 of the primary winding 535 and in contact with a surface of its coils. The attenuation layer 570 comprises a dielectric material having a dielectric coefficient $\varepsilon_a$ greater than a dielectric coefficient $\varepsilon_d$ (averaged if there are multiple different dielectric materials) of the dielectric portion 145.

In an embodiment, the attenuation layer 570 is formed by depositing a first layer of material with a high dielectric coefficient on the insulating layer preceding the metallization layer in which the primary winding 535 is formed (the insulating layer 130$_4$ in the example of FIG. 5). Subsequently, after the formation of the vias 125$_4$, the primary winding 535 of the integrated transformer 505 (with the pad 115) is formed on the first layer of material with a high dielectric coefficient. Possibly, a portion of the first layer of material with a high dielectric coefficient not surmounted by the coils 537 of the primary winding 535 (and by the pad 115) is removed. Finally, a second layer of material with a high dielectric coefficient is deposited on the first winding 535 in such a way to cover integrally each coil 537 thereof (and the pad 115, from which the material of high dielectric coefficient is partially removed in order to allow an electrical connection) and to obtain the attenuation layer 570.

The attenuation layer 570, in particular also disposed along a side face of the primary outer coil 537a adjacent to the lower edge 539 thereof, allows obtaining a more homogeneous alteration of an electric field E5 produced by a potential difference V5 applied between the windings 535 and 140 at the edge 539 of the primary outer coil 537a.

Advantageously, a thickness tc of the attenuation layer 570 is sized in such a way to correspond to an extension of a region in which the equipotential surfaces of the electric field E5 are closer one another in a corresponding transformer in which the attenuation layer 570 is not provided, both towards the integration portion 110 and in a direction of lateral extension (i.e., towards the pad 115 in the example in FIG. 5). With this thickness it is possible to reduce the electric field peak E5p generated in correspondence of the edge 539 of the primary outer coil 537a of the primary winding 535 in a more homogeneous way than in the case of the integrated transformer 405 described with respect to FIG. 4.

Thanks to the embodiments it is possible to obtain an integrated transformer in which electric field peaks able to damage the transformer or able to jeopardize the operation of the transformer and of a system on chip in which such a transformer is integrated are not generate by the fringing effect.

In addition, the various embodiments described above may be combined together without departing from the scope of the present invention. For example, an embodiment of the invention comprises a transformer in which a attenuation layer is provided both below the plate winding and below the primary winding. Another embodiment, comprises a transformer in which an attenuation layer is provided below the primary winding but not below the plate winding. Further embodiments provide an attenuation layer that completely surrounds the coils of the plate and/or of the primary winding (in a similar manner to what described in relation to FIG. 5).

The invention claimed is:

1. An integrated transformer, comprising:
   a primary winding;
   a secondary winding;
   wherein each of the primary and secondary windings is made of a metallic material and has a spiral planar arrangement comprising a corresponding plurality of coils; and
   a dielectric portion of dielectric material interposed between the primary winding and the secondary winding;
   an attenuation layer having a dielectric coefficient greater than a dielectric coefficient of the dielectric portion, said attenuation layer positioned between an upper surface of the dielectric portion and a lower surface of the coils of the primary winding; and
   a field plate winding electrically coupled with the primary winding, wherein the primary winding is positioned between the field plate winding and the secondary winding;
   wherein the field plate winding comprises at least one field plate coil having a lateral extension greater than a lateral extension of a primary outer coil of the primary winding with the at least one field plate coil overlapping in plan view the primary outer coil of the primary winding, the field plate winding being configured to mutually separate equipotential surfaces of an operating electric field at a secondary winding facing edge of the primary outer coil of the primary winding.

2. The integrated transformer according to claim 1, further comprising an additional attenuation layer which surrounds side surfaces and top surfaces of the coils of the primary winding.

3. The integrated transformer according to claim 2, wherein a lower surface of the additional attenuation layer is in contact with the upper surface of the attenuation layer.

4. An integrated transformer, comprising:
   a primary winding;
   a secondary winding;
   wherein each of the primary and secondary windings is made of a metallic material and has a spiral planar arrangement comprising a corresponding plurality of coils; and
   a dielectric portion of dielectric material having an upper surface and a lower surface; and
   an attenuation layer having a dielectric coefficient greater than a dielectric coefficient of the dielectric portion, said attenuation layer having a lower surface in contact with the upper surface of the dielectric portion and having an upper surface in contact with a lower surface of the coils of the primary winding;
   wherein the secondary winding is positioned below the lower surface of the dielectric portion; and
   a field plate winding electrically coupled with the primary winding, wherein the primary winding is positioned between the field plate winding and the secondary winding;
   wherein the field plate winding comprises at least one field plate coil having a lateral extension greater than a lateral extension of a primary outer coil of the primary winding with the at least one field plate coil overlapping in plan view the primary outer coil of the primary winding, the field plate winding being configured to mutually separate equipotential surfaces of an operating electric field at a secondary winding facing edge of the primary outer coil of the primary winding.

5. The integrated transformer according to claim 4, further comprising an additional attenuation layer which surrounds side surfaces and top surfaces of the coils of the primary winding.

6. The integrated transformer according to claim 5, wherein a lower surface of the additional attenuation layer is in contact with the upper surface of the attenuation layer.

7. An apparatus, comprising:
- a semiconductor substrate;
- a plurality of metallization layers over said semiconductor substrate, wherein each metallization layer includes a dielectric material and an electrical element;
- an integrated transformer, comprising:
    - a first winding at a lower-most one of the metallization layers;
    - a second winding at an upper-most one of the metallization layers, wherein at least one metallization layer is between the lower-most and upper-most metallization layers;
    - wherein each of the first and second windings has a spiral planar arrangement comprising a corresponding plurality of coils; and
    - an attenuation layer having a dielectric coefficient greater than a dielectric coefficient of the dielectric material for said metallization layers, said attenuation layer positioned in direct contact with a bottom surface of the second winding and in direct contact with an upper surface of the dielectric material for the upper-most metallization layer.

8. The apparatus according to claim 7, further comprising an additional attenuation layer which surrounds side surfaces and top surfaces of the coil for the second winding.

* * * * *